United States Patent [19]

Iwahashi

[11] Patent Number: 4,821,237

[45] Date of Patent: Apr. 11, 1989

[54] SEMICONDUCTOR MEMORY DEVICE

[75] Inventor: Hiroshi Iwahashi, Yokohama, Japan

[73] Assignee: Kabushiki Kaisha Toshiba, Kanagawa, Japan

[21] Appl. No.: 943,140

[22] Filed: Dec. 18, 1986

[30] Foreign Application Priority Data

Dec. 20, 1985 [JP]  Japan ................... 60-286928

[51] Int. Cl.$^4$ ............................................. G11C 7/00
[52] U.S. Cl. ..................................... 365/189; 365/154
[58] Field of Search ............... 365/189, 154, 156, 181, 365/190

[56] References Cited

U.S. PATENT DOCUMENTS 3,849,675 11/1974 Waaben ........................... 365/154
4,393,471 7/1983 Hart et al. ........................ 365/154
4,578,778 3/1986 Aoyama .......................... 365/154

OTHER PUBLICATIONS

IBM Technical Disclosure Bulletin-vol. 27, No. 4A, Sep. 1984, pp. 1858-1859.
Isobe et al., "A 46ns 256K CMOS RAM", IEEE International Solid-State Circuits Conference, ISSCC Digest of Technical Papers, pp. 214-215, Feb. 23, 1984.

Primary Examiner—James W. Moffitt
Attorney, Agent, or Firm—Finnegan, Henderson, Farabow, Garrett & Dunner

[57] ABSTRACT

This invention provides a semiconductor memory device for reading and writing data comprising a pair of row lines, each having a corresponding electrical potential, the difference between the two potentials increasing during reading of data at least one static memory cell connected between the pair of row lines for storing data written into the memory cell and voltage control means for limiting the increase in the potential difference between the row lines during reading of the data from the memory cell to a predetermined amount for getting fast access time of the reading operation.

11 Claims, 3 Drawing Sheets

SEMICONDUCTOR MEMORY DEVICE

BACKGROUND OF THE INVENTION

1. Field of the Invention

This invention relates to a semiconductor memory device. In particular, the invention relates to an improved semiconductor memory device for controlling the potential difference of respective pairs of row lines in a memory cell array of a static random access memory(SRAM).

2. Description of the Related Art

Various schemes have been adopted to get fast access time of data reading in SRAMs. The chief method which is used at present is to short-circuit a pair of differential input terminals of a sensing amplifier before the address is changed and the column line corresponding to that address is selected and driven. With this method, the speed of data reading is increased by presetting the two input potentials of the sensing amplifier to the same level and then speeding up the application of the potential difference to the pair of row lines in accordance with the data read out from the selected memory cell.

FIG. 1 shows a single column of a memory cell array in a conventional SRAM adopting this method, and the corresponding data reading system. The chief signal waveforms during the reading operation are shown in FIG. 2. More particularly, when an address Add is inputted, a static memory cell 82 is selected in accordance with a selection signal WL of the column line 81 corresponding to this address. Data in the form of two complementary signal levels, referred to herein as Q and $\overline{Q}$, is stored in memory cell 82. Prior to the complementary level data Q and $\overline{Q}$ being read out onto the pair of row lines 83 and $\overline{83}$, precharging transistors 84 and 85 and equalizing transistor 86 are turned ON by changing a control signal $\phi$ to level "1". This control signal $\phi$ is generated in response to an address transition. The turning ON of these three transistors 84, 85 and 86 short-circuits the pair of row lines 83 and $\overline{83}$, thereby equalizing their potentials. When control signal $\phi$ is then subsequently changed to level "0", this turns the transistors 84, 85 and 86 OFF so that the data can be read out from this selected memory cell 82. In this process, there is a rapid increase in the potential difference between row lines 83 and $\overline{83}$, which is detected as data by sensing amplifier 87. This detected data is fed to output buffer 88, from which output data Dout is obtained.

As mentioned above, in a conventional SRAM the control signal $\phi$ is changed to level "1" at a prescribed time after the address Add has changed. Desirably, the cycle of level "1" of this control signal $\phi$ should be the period until the selected column line has been completely brought up to level "1". The reason for this is that if this control signal $\phi$ drops to level "0" before the newly selected column line has become level "1", the potentials of the pair of row lines, which were previously made equal by short-circuiting, will return to their original values depending on the read-out data from the previously selected memory cell. If this situation arises, a long time period will be necessary to sufficiently increase the potential across the row lines in response to the read data of the newly selected memory cell.

In contrast, if control signal $\phi$ is made level "0" after the newly selected column line has been completely brought up to level "1", the sensing amplifier cannot detect the data, since the pair of row lines is short-circuited while control signal $\phi$ is kept at level "1". In this case, the speed of reading the data is decreased. The period for which control signal $\phi$ remains at level "1" is therefore vitally important. However, normally this control signal $\phi$ is formed by comparing the address signal and a signal obtained by delaying this address signal. If, therefore, there is any change in the delay time of the signal due to statistical scatter in the characteristics of the transistors making up the circuit, this will result in statistical scatter of the period for which this control signal $\phi$ is level "1". Thus it is very difficult to optimize this delay time.

SUMMARY OF THE INVENTION

An object of this invention is to provide a semiconductor memory device which can increase the reading speed without a control signal to equalize the potential of the pair of row lines and eliminate the use of transistors for generating this control signal.

This invention provides a semiconductor memory device for reading and writing data comprising a pair of row lines, each having a corresponding electrical potential, the difference between the two potentials increasing during reading of data, at least one static memory cell connected between the pair of row lines for storing data written into the memory cell, and voltage control means for limiting the increase in the potential difference between the row lines during reading of the data from the memory cell to a predetermined amount for getting fast access time of the reading operation.

DETAILED DESCRIPTION OF THE PREFERRED EMBODIMENTS

Embodiments of the invention are described in detail below with reference to the drawings.

Figure 1:
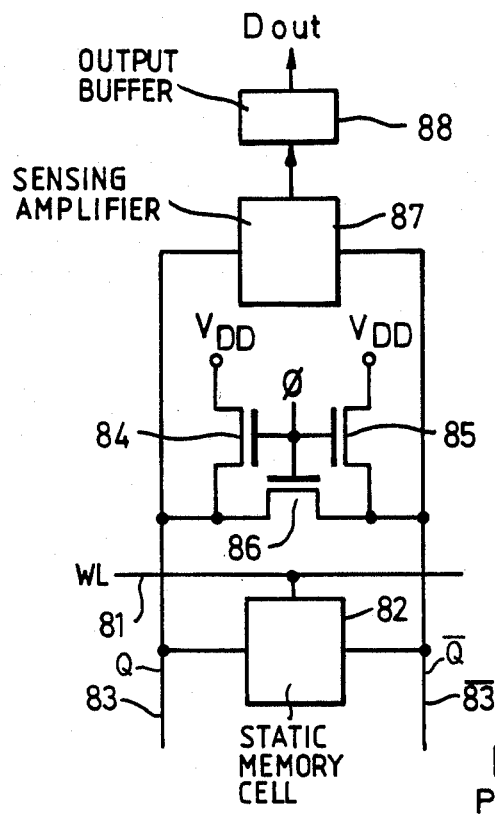
FIG. 1 is a circuit diagram showing part of a conventional SRAM.
Figure 2:
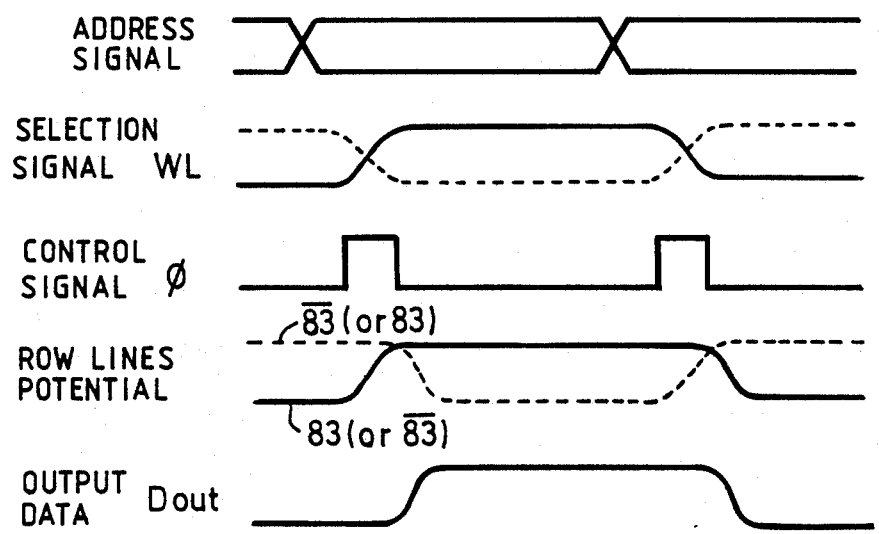
FIG. 2 is a timing diagram showing the data read operation of the memory of FIG. 1.
Figure 3:
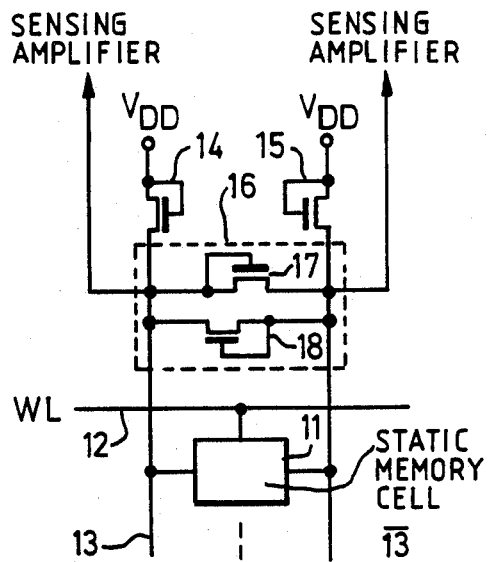
FIG. 3 is a circuit diagram showing part of a SRAM memory cell array according to an embodiment of this invention.

FIG. 3 shows part of a single column in a SRAM memory cell array. A column line 12 is connected to a static memory cell 11. A pair of row lines 13 and $\overline{13}$ is connected to this memory cell 11. Load circuits 14 and 15 of the normally ON type are connected to these row lines 13 and $\overline{13}$. N-channel enhancement type MOS transistors with their respective drains and gates mutually connected, are used for load circuits 14 and 15. A voltage control circuit 16 is connected mutually between these row lines 13 and $\overline{13}$. Two enhancement type MOS transistors 17 and 18, which have their drains and gates mutually connected, are connected in parallel such that the drain and gate of one are connected to the source of the other. The differential input terminals of the sensing amplifiers are connected to these row lines 13 and $\overline{13}$.

Figure 4:
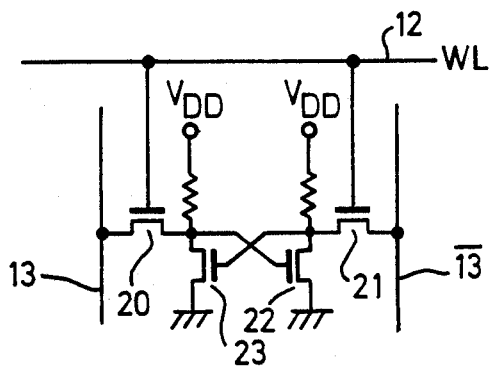
FIG. 4 is a circuit diagram showing part of a static memory cell of FIG. 3.

FIG. 4 shows a circuit diagram of static memory cell 11 in detail. Transistors 20 and 21 turn ON according to the signal of column line 12. The data stored in transistors 22 and 23 are read onto row lines 13 and $\overline{13}$.

Figure 5:
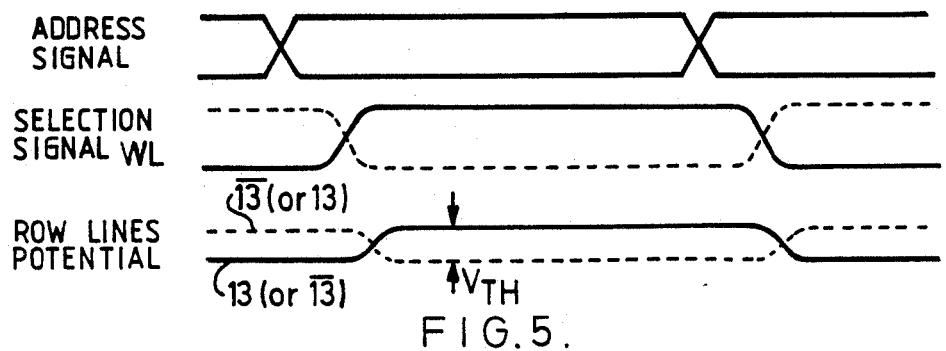
FIG. 5 is a timing diagram showing the data reading operation in the memory of FIG. 3.

The read operation of an SRAM will be described with reference to FIG. 5. As mentioned above, normally ON type load circuits 14 and 15 are connected to the pair of row lines 13 and $\overline{13}$ and voltage control circuit 16 is connected between the pair of row lines 13 and $\overline{13}$. When the address Add is inputted, a memory cell 11 is selected in accordance with selecting signal WL on column line 12 corresponding to this address. As a result, complementary level data Q and $\overline{Q}$ are read from this memory cell 11 onto the pair of row lines 13 and $\overline{13}$, causing the potential difference of these row lines 13 and $\overline{13}$ to be rapidly increased. However in this case, due to the action of the voltage control circuit 16, the potential difference of these row lines 13 and $\overline{13}$ is restricted, so that it cannot exceed the threshold voltage $V_{TH}$ of transistors 17 and 18. Then the potential difference across this pair of row lines 13 and $\overline{13}$ is detected as data by the sensing amplifiers. This detected data is fed to the output buffer, and is transmitted as output data. Consequently, when data reading is next performed, the difference between the potential of the low-potential row line and the potential of the high-potential row line is small (about threshold voltage $V_{TH}$ of the transistors 17 and 18), so the data reading time can be shortened.

Figure 6:
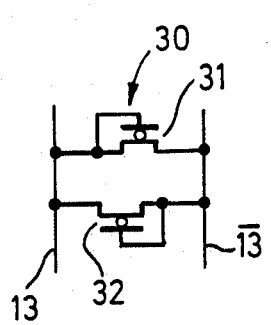
FIGS. 6 to 12 are circuit diagrams showing other embodiments of the voltage control circuit of FIG. 3.
Figure 7:
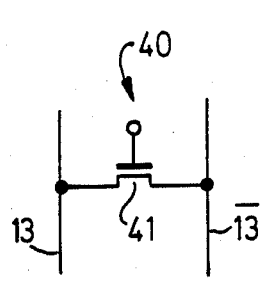
Figure 8:
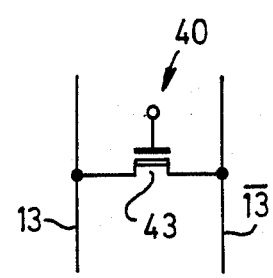
Figure 9:
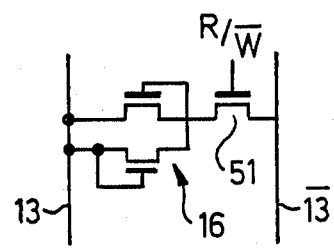
Figure 10:
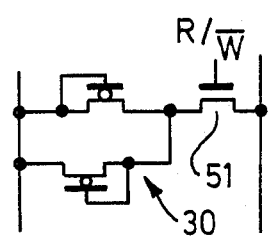
Figure 11:
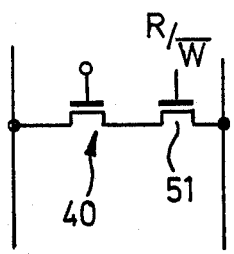
Figure 12:
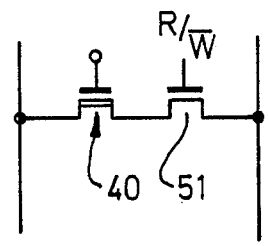

This invention is not restricted to the above embodiment. As shown in FIG. 6, a voltage control circuit 30 can be employed. Voltage control circuit 30 has MOS transistors 31 and 32 whose threshold voltages are about 0 volts. These MOS transistors 31 and 32 are sued with their drains and gates connected together in each case. In this case, the potential difference across row lines 13 and $\overline{13}$ is determined by the conduction resistance of these transistors 31 and 32, so that potential difference across the row lines can be made even smaller than in the case of the previous embodiment. Further, a voltage control circuit 40, as shown in FIG. 7, can be employed. A prescribed voltage is applied to the gate of an N-channel enhancement type MOS transistor 41. In this case too, the potential difference across the pair of row lines is determined by the conduction resistance of this transistor 41. In addition, a voltage control circuit 43 as shown in FIG. 8 can be employed. A prescribed voltage is applied to the gate of a depletion type MOS transistor 43. In this case too, the potential difference across the pair of row lines is determined by the conduction resistance of this transistor 43.

In data writing to an SRAM, as described above, in order to make the potential difference across the pair of row lines as large as possible it is preferable not to carry out voltage control as in the above-mentioned embodiments. As shown in FIGS. 9 to 12, this can be done, for example, by inserting an N-channel enhancement type MOS transistor 51 in series in each case with the voltage control circuits 16, 30, and 40 of FIGS. 3, 6, 7 and 8 and supplying the gate of this transistor 51 with a control signal R/$\overline{W}$ that is "1" in the read mode and "0" in the write mode.

Of course, it is possible to use transistors 41 and 43, shown in FIGS. 7 and 8, respectively, as voltage control circuits and employ the switching transistor 51, as described above, by supplying to it a control signal R/$\overline{W}$ to the gate electrode of transistor 51.

With a semiconductor memory device according to this invention as described above, the speed at which data is read out can be increased because of the provision of a voltage control circuit that restricts the potential difference between the pair of row lines. This is accomplished by an operation such in which the pair of row lines control each other's potential in the data reading period. Furthermore, a control signal to equalize the potential of the pair of row lines in the precharging period is unnecessary, so the transistors for generating such a control signal are unnecessary and reading of data from the memory cells can always be performed in a stable manner unaffected by statistical scatter of the characteristics of such transistors.

As a result, the reading speed can be increased. In particular, when reading of data from the memory cells is carried out continuously, the time required to precharge the pair of row lines for reading out fresh data can be shortened.

Various modifications and variations could be made to the invention without departing from the scope or spirit of the invention.

What is claimed is:

1. A semiconductor memory device for reading and writing data comprising:

a pair of row lines, each having a corresponding electrical potential, the difference between the two potentials increasing during reading of data;

at least one static memory cell connected between the pair of row lines for storing data written into the memory cell;

switching means for connecting the static memory cell to the row lines in accordance with a selecting signal; and voltage control means for limiting the increase in the potential difference between the row lines to perform the reading of the data from the memory cell at a predetermined restricted potential allowing fast access time during the reading operation.

2. The semiconductor memory device according to claim 1 wherein the voltage control means includes two MOS transistors coupled in parallel between the pair of row lines, the drains and gates of the two transistors being connected together and the drain of one transistor being connected to the source of the other.

3. The semiconductor memory device according to claim 2 wherein the voltage control means also includes a MOS switching transistor coupled in series to the two MOS transistors, the switching transistor being in the ON state when data is read from the memory cell, and in the OFF state when data is written into the memory cell.

4. The semiconductor memory device according to claim 2 wherein each of the two MOS transistors has a threshold voltage of about 0 (V).

5. The semiconductor memory device according to claim 4 wherein the voltage control means also includes a MOS switching transistor coupled in series to the two MOS transistors, the switching transistor being in the ON state when data is read from the memory cell, and in the OFF state when data is written into the memory cell.

6. The semiconductor memory device according to claim 1 wherein the voltage control means includes an enhancement type MOS transistor coupled between the pair of row lines, and wherein a prescribed voltage is applied to the gate of the the enhancement transistor.

7. The semiconductor memory device according to claim 6 wherein the voltage control means also includes a MOS switching transistor coupled in series to the enhancement type MOS transistor, the switching transistor being in the ON state when data is read from the memory cell, and in the OFF state when data is written into the memory cell.

8. The semiconductor memory device according to claim 1 wherein the voltage control means includes a depletion type MOS transistor coupled between the pair of row lines having a prescribed voltage applied to the gate thereof.

9. The semiconductor memory device according to claim 8 wherein the voltage control means also includes a MOS switching transistor coupled in series to the depletion type MOS transistor, the switching transistor being in the ON state when data is read from the memory cell, and in the OFF state when data is written into the memory cell.

10. The semiconductor memory device according to claim 1 wherein the voltage control means limits the increase in the potential difference at least prior to the reading of the data.

11. The semiconductor memory device according to claim 1 wherein the voltage control means limits the increase in the potential difference after the reading of the data.

* * * * *